(12) United States Patent
Müller et al.

(10) Patent No.: US 6,423,929 B1
(45) Date of Patent: Jul. 23, 2002

(54) DEVICE FOR THE LASER PROCESSING OF FLAT WORKPIECES

(75) Inventors: Lothar Müller, Heidelberg; Daniel Metz, Kandel; Stefan Dietrich, Karlsruhe, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/743,890
(22) PCT Filed: Jul. 1, 1999
(86) PCT No.: PCT/DE99/01932
§ 371 (c)(1), (2), (4) Date: Jan. 16, 2001
(87) PCT Pub. No.: WO00/03830
PCT Pub. Date: Jan. 27, 2000

(30) Foreign Application Priority Data

Jul. 14, 1998 (DE) .......................... 198 31 558

(51) Int. Cl.$^7$ .......................... B23K 26/00; H05K 13/00
(52) U.S. Cl. ................ 219/121.67; 219/121.61
(58) Field of Search ................ 219/121.63, 121.64, 219/121.65, 121.66, 121.67, 121.68, 121.69, 121.7, 121.71, 121.72, 121.82, 161; 269/257

(56) References Cited

U.S. PATENT DOCUMENTS

| | | | | |
|---|---|---|---|---|
| 3,754,436 A | * | 8/1973 | Saxton | 73/81 |
| 4,328,410 A | | 5/1982 | Slivinsky et al. | |
| 4,658,110 A | * | 4/1987 | Miller et al. | 219/121.63 |
| 4,730,819 A | | 3/1988 | Hirschhorn et al. | |

FOREIGN PATENT DOCUMENTS

| | | |
|---|---|---|
| DE | 195 27 070 | 10/1996 |
| EP | 0 606 928 | 7/1994 |
| GB | 2 332 637 | 12/1998 |
| WO | WO 96/26040 | 8/1996 |

* cited by examiner

Primary Examiner—Samuel M. Heinrich
(74) Attorney, Agent, or Firm—Harness, Dickey & Pierce, P.L.C.

(57) ABSTRACT

A workpiece, designed as a printed circuit board for example, can be moved by means of a transport device under a laser unit in such a way that a region to be machined of the workpiece passes into the deflecting region of the laser beam. The workpiece is set between clamping jaws to a vertical position in which the laser beam is focused exactly on that surface of the workpiece which is to be machined. As a result, the machining accuracy can be considerably increased.

5 Claims, 1 Drawing Sheet

DEVICE FOR THE LASER PROCESSING OF FLAT WORKPIECES

BACKGROUND OF THE INVENTION

The invention relates to an apparatus for the laser machining of at least one plate-like flat workpiece, in particular an electrical printed circuit board, in the working area of at least one laser unit, which produces a deflectable focused laser beam, in which case a region to be machined of the workpiece can be positioned in the deflecting region of the laser unit.

It is normal practice to inscribe sheet-like workpieces by means of a deflectable laser beam with the workpiece being transported into the radiant area of a laser unit and with the printed circuit board resting on a work table. With larger printed circuit boards, in particular, or small printed circuit boards combined to form a large panel, bending of the boards occurs, and this bending makes accurate focusing of the laser beam on the surface of the printed circuit board more difficult.

SUMMARY OF THE INVENTION

The object of the invention is to increase the machining accuracy of the apparatus.

This object is achieved by an apparatus for the laser machining of at least one plate-like workpiece, in particular an electrical printed circuit board. The apparatus has at least one laser unit with a deflectable focused laser beam having a deflecting region for the unit, a transport device for transporting a workpiece into the region, a holding device having pincer-like clamping jaws which can be placed in position on both sides of the workpiece and can be positioned in the deflecting region of the laser unit. The holding device lifts the workpiece from the transport device and the clamping surface of the clamping jaws are arranged to surround the deflecting region of the laser beam with at least one of the clamping jaws having an aperture for the laser beam to pass therethrough to contact the workpiece and the clamping jaws are set to a defined vertical position. Due to the clamping of the work carrier in a narrow working area, it is possible to largely rule out the curvature-induced deviations in distance, the workpiece being completely released from the transport device and being held at a suitable height.

Preferably, one clamping jaw presses the workpiece against the other clamping jaw which is raised to a fixed vertical position, the vertical position of the workpiece can be set without the need for particular control input.

Preferably, the laser unit and the clamping jaw which can be vertically fixed are arranged on the same side of the workpiece, so that the workpiece surface to be machined can be set exactly to the focus of the laser beam without thickness tolerances of the workpiece being a factor in the process.

A second laser unit for simultaneously machining the opposite side of the workpiece can be provided and the clamping jaws are adjustable in their vertical position so that a center plane of the workpiece can be centered at a defined vertical position. Thus, the positional deviations of the workpiece which are caused by thickness differences can be considerably reduced.

The invention is explained in more detail below with reference to an exemplary embodiment shown in the drawing.

DESCRIPTION OF THE PREFERRED EMBODIMENTS

Figure 1:
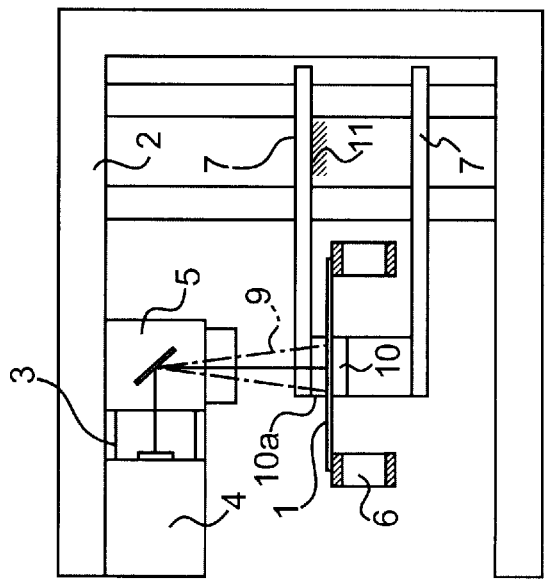
FIG. 1 schematically shows a side view of an apparatus for the laser machining of flat workpieces.
Figure 2:
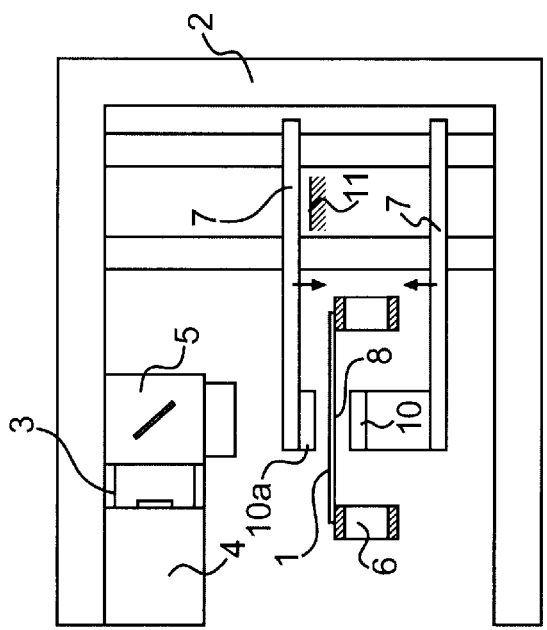
FIG. 2 shows the apparatus according to FIG. 1 during a machining phase.
Figure 3:
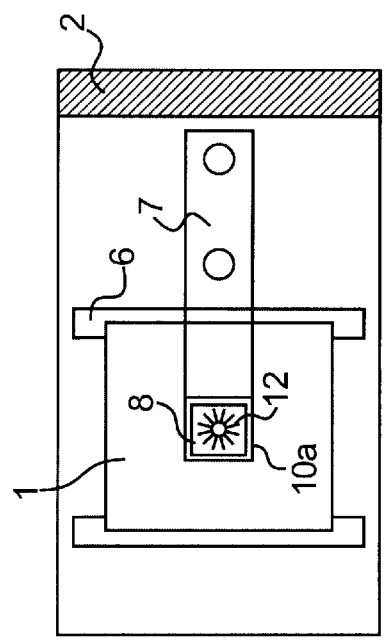
FIG. 3 shows a plan view of the apparatus according to FIG. 1.

According to FIGS. 1, 2 and 3, an apparatus for the laser machining of flat workpieces 1 consists of a frame-like support 2 for a laser unit 3 which is composed of a laser-beam generator 4 and a deflecting device 5. In addition, a transport device 6 and a holding device 7 are anchored on the support 2.

The transport device 6 moves the workpiece 1 into a position in which a region 8 to be machined of the workpiece can be moved into the deflecting region 9 of the laser unit 3 with the workpiece 1 passing between open clamping jaws 10 and 10a of the holding device 7. Said clamping jaws 10 and 10a are adjustable in a direction perpendicular to the workpiece plane and, as shown in FIG. 2, are moved toward the workpiece. On the side facing the laser unit 3, it is ensured in this case, for example by a stop 11, that this clamping jaw 10a assumes a uniform vertical position in such a way that the workpiece 1 is at least slightly lifted from the transport device 6 by the other clamping jaw.

The workpiece 1 is now fixed and held merely between the two clamping jaws. The clamping jaws 10 and 10a, which are of frame-shaped design, enclose the relatively small deflecting region 9 of the laser beam at a close distance apart, as a result of which the clamping area remains small and arching or bending in the workpiece 1 becomes negligible. As a result, the surface to be structured by the laser beam can be secured in a precise vertical position, so that even very narrow printed conductors 12 (see FIG. 3) can be produced.

We claim:

1. An apparatus for the laser machining of at least one plate-like workpiece, said apparatus comprising a frame, a laser unit mounted in the frame and producing a focused laser beam, which is deflectable over a deflecting region, a transport device for moving a workpiece into the machine, a holding device for holding the workpiece during machining with the laser beam, said holding device having a pair of pincer-like clamping jaws which can be placed on both sides of the workpiece in a position adjacent the deflecting region of the laser unit, said holding device lifting the workpiece from the transport device with the clamping surface of the clamping jaws being arranged adjacent to the deflecting region of the laser beam with at least one of the clamping jaws having an aperture for the laser beam to extend therethrough and the clamping jaws being set in a defined vertical position.

2. An apparatus according to claim 1, wherein the other of the pair of clamping jaws presses the workpiece against the one clamping jaw which moves into a fixed vertical position.

3. An apparatus according to claim 2, wherein the laser unit and the one clamping jaw are arranged on the same side of the workpiece.

4. An apparatus according to claim 1, which includes a second laser unit positioned on the opposite side of the workpiece from the first-mentioned laser unit so that both sides of the workpiece can be machined simultaneously, said clamping jaws being adjustable in their vertical position so that a center plane of the workpiece can be centered at a defined vertical position.

5. An apparatus according to claim 1, wherein said at least one clamping jaw and the laser unit are arranged on the same side of the workpiece.

* * * * *